United States Patent
Simons et al.

(10) Patent No.: US 7,468,795 B2
(45) Date of Patent: Dec. 23, 2008

(54) METHOD OF SELECTING A GRID MODEL FOR CORRECTING A PROCESS RECIPE FOR GRID DEFORMATIONS IN A LITHOGRAPHIC APPARATUS AND LITHOGRAPHIC ASSEMBLY USING THE SAME

(75) Inventors: Hubertus Johannes Gertrudus Simons, Venlo (NL); Henricus Johannes Lambertus Megens, Waalre (NL); Everhardus Cornelis Mos, Best (NL); Leonardus Henricus Marie Verstappen, Weert (NL); Roy Werkman, Waalre (NL); Henricus Jacobus Maria Verhoeven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 202 days.

(21) Appl. No.: 11/484,849

(22) Filed: Jul. 12, 2006

(65) Prior Publication Data

US 2007/0021860 A1    Jan. 25, 2007

Related U.S. Application Data

(60) Provisional application No. 60/814,531, filed on Jun. 19, 2006, provisional application No. 60/697,988, filed on Jul. 12, 2005.

(51) Int. Cl.
*G01B 11/00* (2006.01)
(52) U.S. Cl. .................................................. 356/401
(58) Field of Classification Search ......... 356/399–401, 356/614
See application file for complete search history.

(56) References Cited

U.S. PATENT DOCUMENTS

| | | | | |
|---|---|---|---|---|
| 4,531,060 A | * | 7/1985 | Suwa et al. | 250/548 |
| 5,543,921 A | * | 8/1996 | Uzawa et al. | 356/401 |
| 6,023,338 A | * | 2/2000 | Bareket | 356/401 |
| 6,064,486 A | * | 5/2000 | Chen et al. | 356/401 |
| 6,218,200 B1 | * | 4/2001 | Chen et al. | 438/14 |
| 6,288,454 B1 | * | 9/2001 | Allman et al. | 257/797 |
| 6,340,547 B1 | * | 1/2002 | Chen et al. | 430/22 |

(Continued)

FOREIGN PATENT DOCUMENTS

| EP | 1 235 116 A1 | 8/2002 |
|---|---|---|
| WO | 2004/077534 A1 | 9/2004 |
| WO | 2005/045364 A1 | 5/2005 |

OTHER PUBLICATIONS

European Search Report issued in EP 06 11 6659 dated Nov. 27, 2006.

*Primary Examiner*—Tarifur R. Chowdhury
*Assistant Examiner*—Isiaka O Akanbi
(74) *Attorney, Agent, or Firm*—Pillsbury Winthrop Shaw Pittman LLP

(57) ABSTRACT

A method of selecting a grid model for correcting a process recipe for grid deformations in a lithographic apparatus is disclosed. First a set of grid models is provided. Subsequently, alignment data are obtained by performing an alignment measurement on a plurality of alignment marks on a number of substrates. For each grid model it is checked whether the alignment data is suitable to solve the grid model. If so, the grid model is added to a subset of grid models. The grid model with lowest residuals is selected. In addition to alignment data, metrology data may be obtained by performing an overlay measurement on a plurality of overlay marks on the number of substrates. For each grid model of the subset simulated metrology data may then be determined that is used to determine overlay performance indicators. The grid model is then selected using the overlay performance indicators.

34 Claims, 10 Drawing Sheets

U.S. PATENT DOCUMENTS

| | | | |
|---|---|---|---|
| 6,815,232 B2 * | 11/2004 | Jones et al. | 438/14 |
| 6,937,337 B2 * | 8/2005 | Ausschnitt et al. | 356/401 |
| 7,312,873 B2 * | 12/2007 | Haginiwa | 356/401 |
| 2004/0223157 A1 * | 11/2004 | Nakajima | 356/401 |
| 2005/0248740 A1 | 11/2005 | Van Der Veen et al. | 355/53 |
| 2006/0072087 A1 | 4/2006 | Klinkhamer et al. | 355/53 |

* cited by examiner

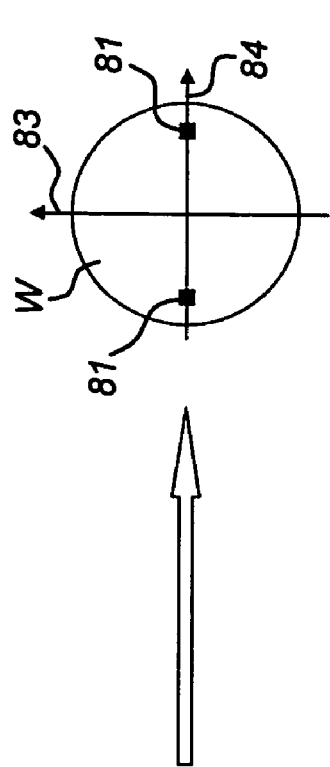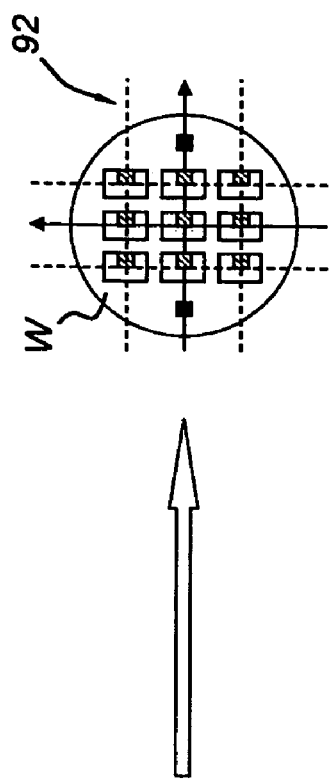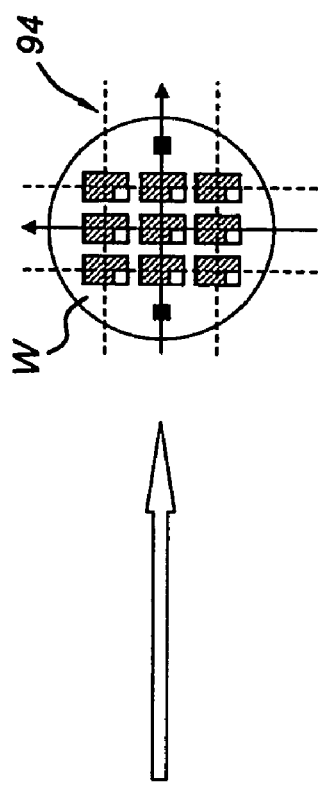

METHOD OF SELECTING A GRID MODEL FOR CORRECTING A PROCESS RECIPE FOR GRID DEFORMATIONS IN A LITHOGRAPHIC APPARATUS AND LITHOGRAPHIC ASSEMBLY USING THE SAME

RELATED APPLICATIONS

This application claims priority of U.S. Provisional Application No. 60/814,531, filed Jun. 19, 2006 and U.S. Provisional Application No. 60/697,988, filed Jul. 12, 2005, the entire contents of each application is hereby incorporated by reference.

FIELD

The present invention relates to a method of selecting a grid model for correcting a process recipe for grid deformations in a lithographic apparatus and a computer program product for performing, when executed by a processor, that method. The present invention further relates to a lithographic assembly using that method, and a device manufacturing method using that lithographic assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In scanners, target portions are irradiated in accordance with a certain grid, i.e. a scanner grid. Generally, such a scanner grid is an absolute grid, i.e. the grid points are defined by absolute coordinates, and not for instance by relative distances. During processing of the substrate, during or after exposure, the pattern, and thus the grid, as transferred on the substrate may be distorted. Consequently, if a first pattern is transferred to a first layer n in accordance with the scanner grid, and due to processing of layer n this grid is distorted after transfer, transferring a second pattern towards a next layer, i.e. a second layer n+1 on top of the first layer, by using a similar grid as used to transfer the first pattern may lead to misalignment of the first and second patterns in layers n and n+1 respectively.

SUMMARY

It is desirable to provide a method of correcting a process recipe for grid deformations in a lithographic apparatus with an improved performance in view of the prior art.

An embodiment of the invention provides a method of selecting a grid model for correcting a process recipe for grid deformations in a lithographic apparatus comprising: providing a set of grid models; obtaining alignment data by performing an alignment measurement on a first plurality of alignment marks on a plurality of first substrates; checking for each grid model of the set of grid models whether alignment data as obtained is suitable to solve the grid model and, if the alignment data is suitable to solve the grid model adding the grid model to a subset of grid models; and selecting a grid model from the subset of grid models with lowest residuals.

An embodiment of the invention further relates to a computer program product for performing, when executed by a processor, aforementioned method of selecting a grid model for correcting a process recipe for grid deformations in a lithographic apparatus.

An embodiment of the invention further relates to a lithographic assembly comprising: a lithographic system comprising a lithographic apparatus configured to project a patterned beam of radiation onto a target portion of a substrate, a control unit arranged to control settings of the lithographic apparatus and an alignment system arranged to perform an alignment measurement on the substrate prior and/or after projection by the lithographic apparatus and to generate alignment data; a metrology system comprising a metrology apparatus and a metrology control unit, the metrology system being arranged to perform an overlay measurement on said substrate and to generate metrology data as a result of the overlay measurement; and a control system connected to both the lithographic system and the metrology system, and arranged to receive the alignment data from the lithographic system and the metrology data from the metrology system; wherein the control system comprises a processor and a memory, the memory being connected to the processor and arranged to store a process recipe and a set of models, and wherein the lithographic assembly is arranged to perform aforementioned method of selecting a grid model for correcting a process recipe for grid deformations in a lithographic apparatus.

An embodiment of the invention further relates to a device manufacturing method comprising transferring a pattern from a patterning device onto a substrate using the aforementioned lithographic assembly.

An embodiment of the invention further relates to a method of selecting a grid model for correcting a process recipe for grid deformations in a lithographic apparatus comprising: providing a set of grid models; obtaining alignment data by performing an alignment measurement on a first plurality of alignment marks on a plurality of first substrates; obtaining metrology data by performing an overlay measurement on a first plurality of overlay marks on the plurality of first substrates; checking for each grid model of said set of grid models whether alignment data as obtained is suitable to solve the grid model and, if the alignment data substrate to solve the grid model adding the grid model to a subset of grid models; determining simulated metrology data for each grid model of the subset of grid models; determining overlay performance indicators of the simulated metrology data for each model of the subset of grid models; and selecting grid model using the overlay performance indicators as determined.

An embodiment of the invention further relates to a computer program product for performing, when executed by a processor, the aforementioned method of selecting a grid model for correcting a process recipe for grid deformations in a lithographic apparatus.

An embodiment of the invention further relates to a lithographic assembly comprising: a lithographic system comprising a lithographic apparatus configured to project a patterned beam of radiation onto a target portion of a substrate, a control unit arranged to control settings of the lithographic apparatus and an alignment system arranged to perform an alignment measurement on the substrate prior and/or after projection by the lithographic apparatus and to generate alignment data; a metrology system comprising a metrology apparatus and a metrology control unit, the metrology system being arranged to perform an overlay measurement on the substrate and to generate metrology data as a result of the overlay measurement; and a control system connected to both the lithographic system and the metrology system, and arranged to receive the alignment data from the lithographic system and the metrology data from the metrology system; wherein the control system comprises a processor and a memory, the memory being connected to the processor and arranged to store a process recipe and a set of models, and wherein the lithographic assembly is arranged to perform the aforementioned method of selecting a grid model for correcting a process recipe for grid deformations in a lithographic apparatus.

Finally, an embodiment of the invention relates to a device manufacturing method comprising transferring a pattern from a patterning device onto a substrate using aforementioned lithographic assembly.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7a-c schematically depict a first example of determining grids by a grid model in accordance with embodiments of the invention;

DETAILED DESCRIPTION

Figure 1:
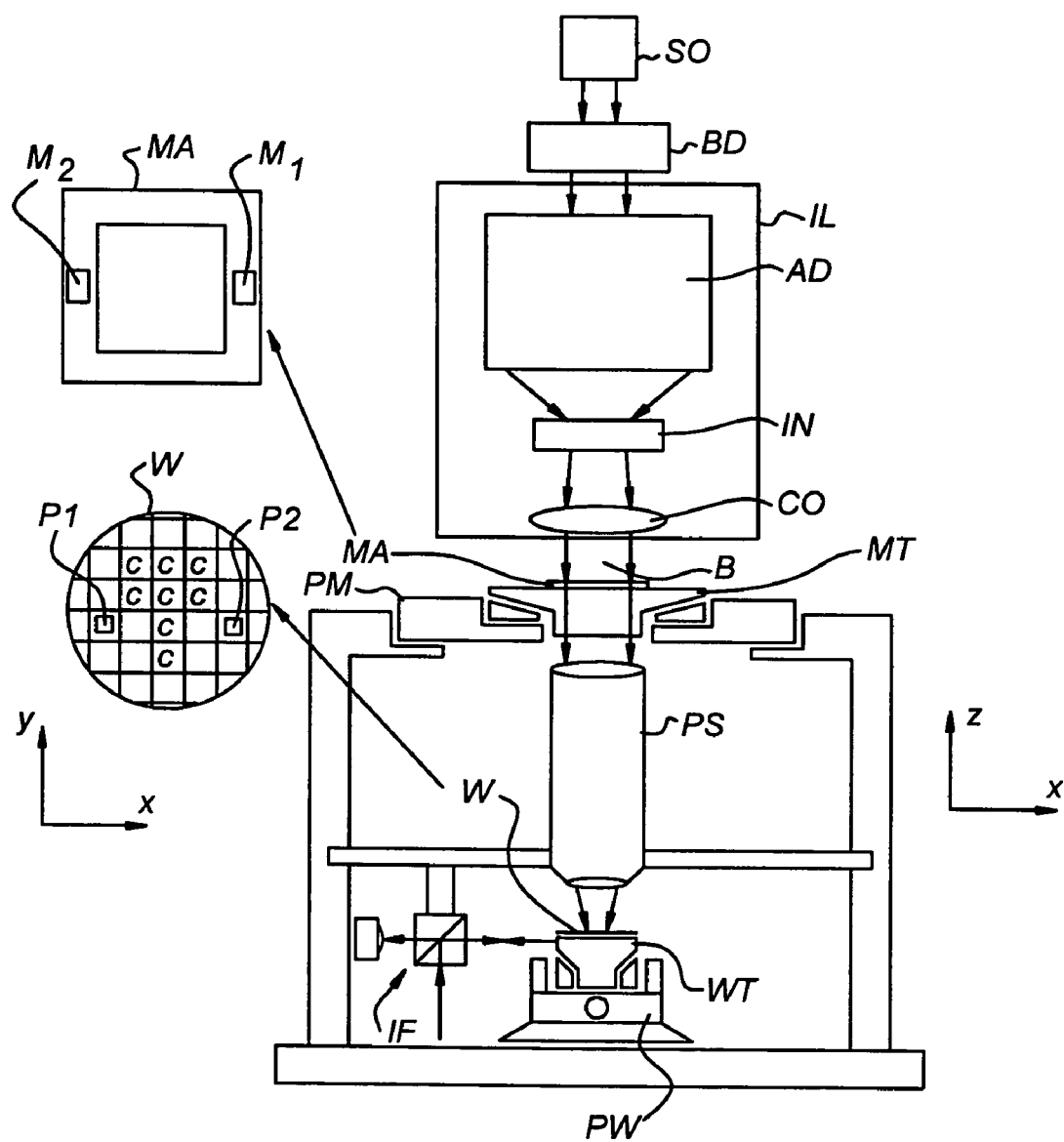
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of an exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
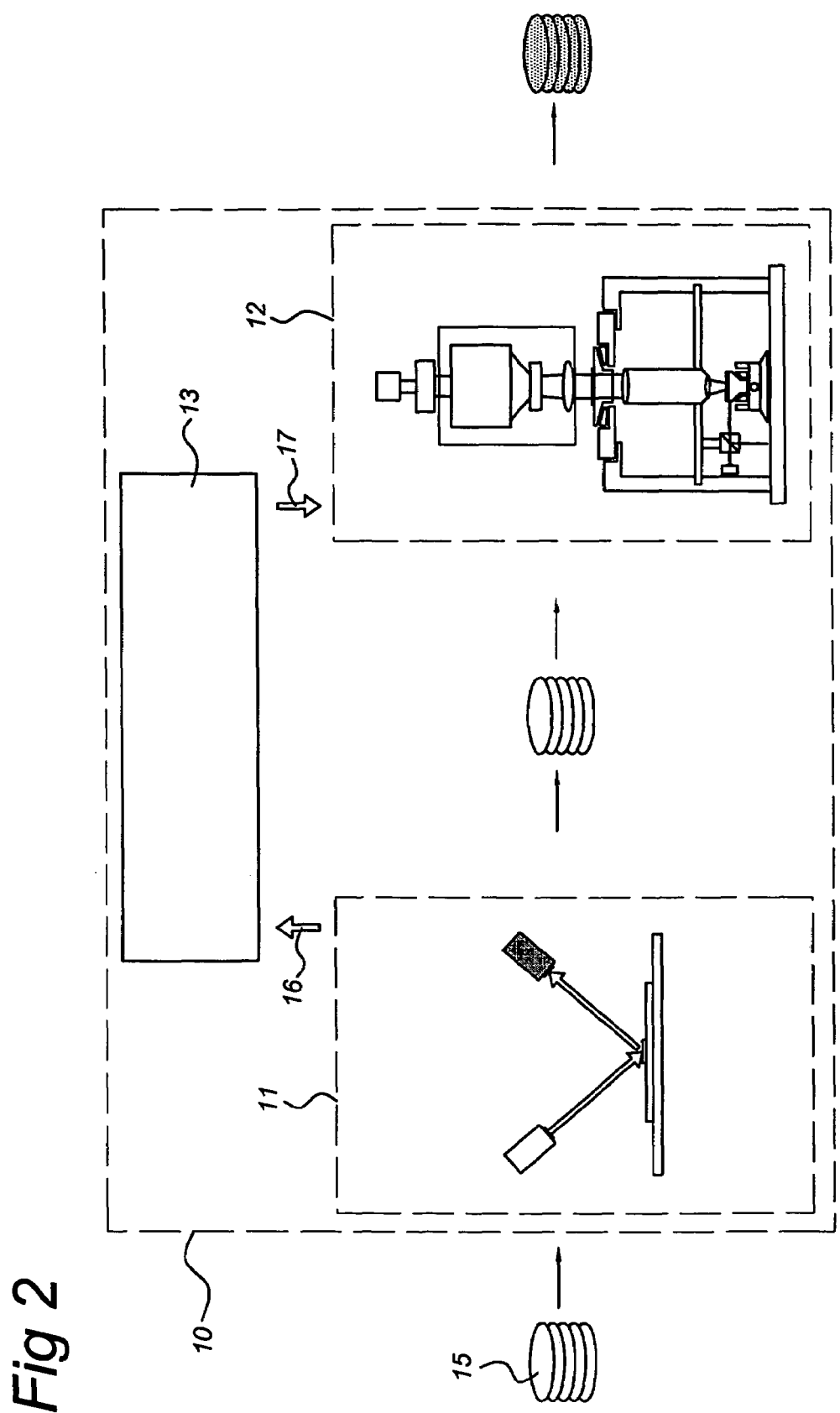
FIG. 2 depicts a lithographic assembly comprising a lithographic apparatus, an alignment system and a control unit.

FIG. 2 depicts a lithographic assembly 10 comprising an alignment system 11, a lithographic apparatus 12 and a control unit 13. A plurality of substrates W, schematically shown as a lot 15, can be entered into the assembly 10. The alignment system 11 measures the substrates in lot 15, which results in alignment data. The alignment data are sent towards the control unit 13, which action is schematically depicted by arrow 16. The control unit 13 may then adapt exposure data based on the alignment data as received. The exposure data are sent towards the lithographic apparatus 12, which is schematically depicted by arrow 17. The lot 15 of substrates is now transferred towards the lithographic apparatus 12 and each substrate W of the lot 15 undergoes an exposure in accordance with the exposure data sent by the control unit 13. After exposure, the lot 15 of substrates is removed from the assembly 10. The fact that the substrates W in the lot 15 have been exposed is schematically depicted by the dotted filling.

Figure 3:
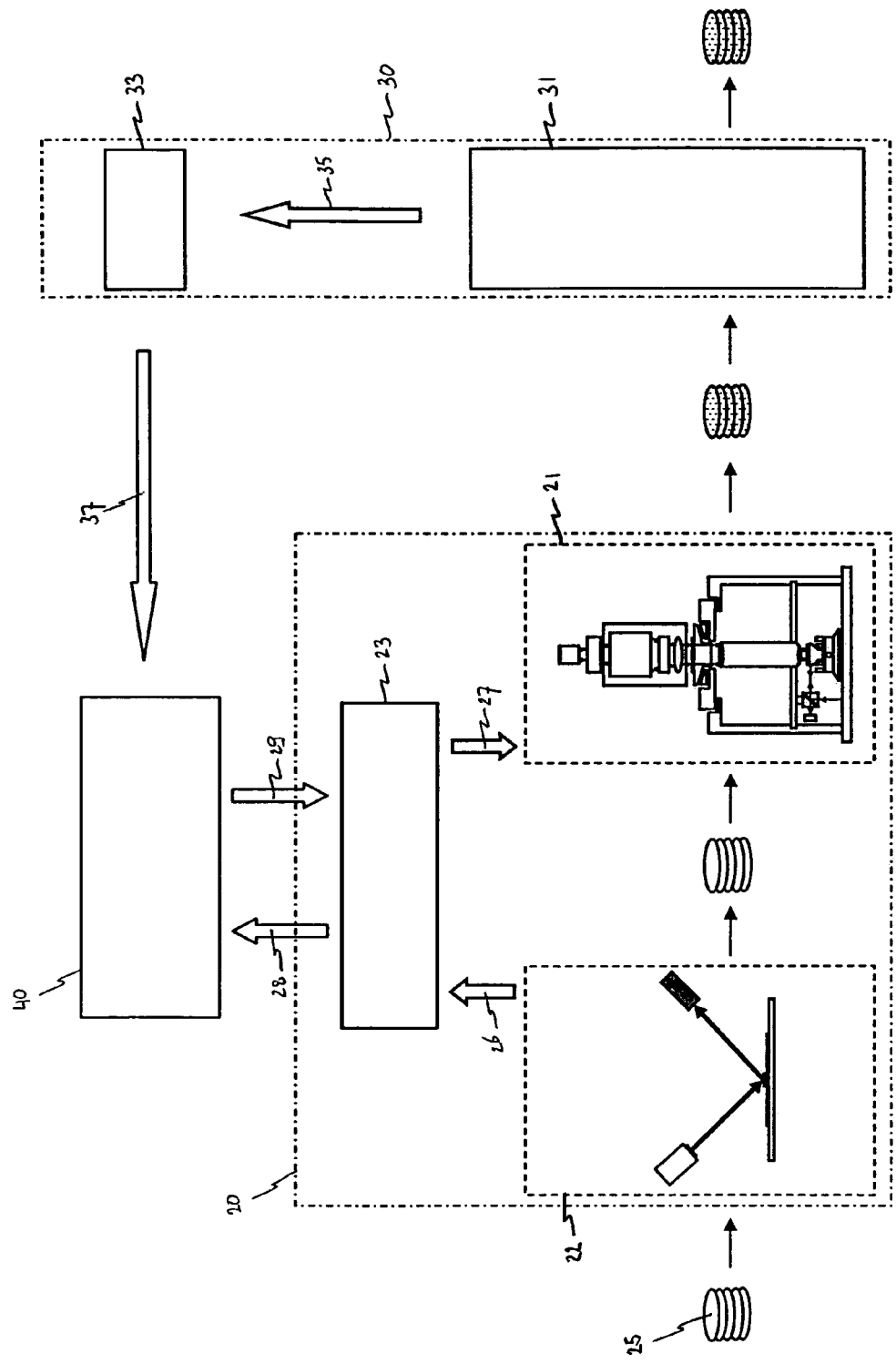
FIG. 3 depicts a lithographic apparatus and a metrology system connected via a track.

FIG. 3 depicts a lithographic system 20, a metrology system 30 and a control system 40. A substrate or substrate lot transfer system may provide a connection between systems 20, 30. Alternatively, systems 20, 30 may be connected via a track. The lithographic system 20 comprises a lithographic apparatus 21, and may comprise an alignment system 22. The relation between lithographic apparatus 21 and alignment system 22 has already been explained with reference to FIG. 2. The lithographic system 20 may further comprise a control unit 23, which is connected to lithographic apparatus 21, and may have a similar functionality as control unit 13 in FIG. 2. A lot 25 of substrates may be entered into the lithographic system 20 for exposure by the lithographic apparatus 21 based on exposure data received from the control unit 23. The transfer of the exposure data, e.g. in the format of an expose recipe, is schematically depicted by arrow 27. The exposure data may be adapted in view of alignment data obtained with the alignment system 22. The alignment data are sent towards the control unit 23, schematically depicted by arrow 26, to serve as a possible basis for adaptation of exposure data. It must be understood that alignment system 22, although depicted as a separate unit apart from lithographic apparatus 21, may be accommodated by lithographic apparatus 21, as is known to a person skilled in the art.

The exposed substrates in lot 25 leave the lithographic system 20 and are transferred towards metrology system 30, e.g., via a lot transfer system or in another way as is known to a person skilled in the art. In the metrology system 30, which comprises a metrology apparatus 31 and a metrology control unit 33, positions of specified features are measured as is known to persons skilled in the art. The measured data, called metrology data, are sent towards the metrology control unit 33. The transfer of metrology data from metrology apparatus 31 towards metrology control unit 33 is schematically depicted by arrow 35. The metrology control unit 33 may then adapt the metrology data in to a format suitable for control system 40. The subsequent transfer of the metrology data from metrology control unit 33 towards control system 40 is schematically depicted by arrow 37. The metrology data may be used by the control system 40 to adapt exposure data in an expose recipe as is known to persons skilled in the art.

Generally, a lithographic system 20 is connected to other processing equipment, e.g. via a track. Examples of such processing equipment include ovens for post exposure baking, etching machines for etching and polishing devices for chemical-mechanical polishing (CMP). In order to maintain a certain throughput, lots 25 of substrates need to be processed in each machine of the processing equipment within a similar period of time. Thus, in case a metrology system 30 is positioned within a track, the throughput of the metrology system 30 is bound by the performance of the track and vice versa.

The control system 40 may be an advanced process control (APC) system. APC-systems are commonly used to ensure good overlay. After exposure of a lot, the overlay is measured on a few substrates from the lot, e.g. by using a metrology system 30. The measured overlay data is then either directly or after some kind of pre-processing by the metrology control unit 33, sent to the APC-system. Subsequently, the APC-system calculates overlay corrections, based on exposure and processing history, and these corrections may be used to adjust the lithographic apparatus, e.g. lithographic apparatus 21, to minimize the overlay error. This is also referred to as an overlay metrology feedback loop. The adjustments calculated by the control system 40, in one embodiment being an APC-system, are communicated with the control unit 23 of the lithographic system 20, which is schematically depicted by arrow 29. In an embodiment, the control system 40 is an APC-system that also takes alignment data obtained with alignment system 22 into account for purposes that will be explained later in the description. The transfer of alignment data from the control unit 23 of the lithographic system 20 towards the control system 40 for these purposes is schematically depicted by arrow 28.

The control system 40 is generally located outside the lithographic system 20 and metrology system 30. In an embodiment, control system 40 may be connected to multiple lithographic systems 20 and metrology systems 30 simultaneously. The control system 40, especially in an embodiment related to an APC-system, may further be operable by an operator independently of lithographic system 20 and metrology system 30.

Figure 4A:
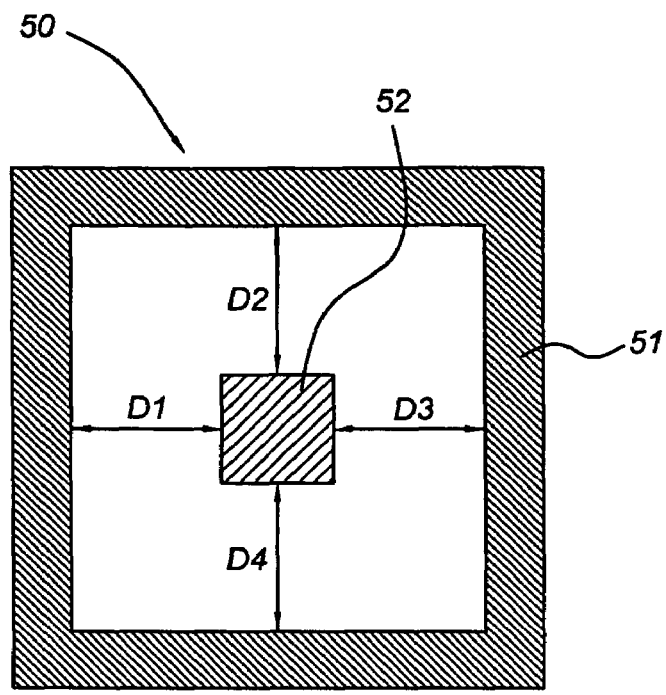
FIG. 4a depicts a typical example of an overlay mark.

Alignment data as referred to earlier in this description may be obtained by measurements on alignment marks with an alignment system, e.g. alignment system 11. Similarly, metrology data may be obtained by measurements on overlay marks with a metrology apparatus, e.g. metrology apparatus 31. A typical example of an overlay mark is depicted in FIG. 4a. The overlay mark 50 comprises an outer structure 51 and an inner structure 52. The outer structure 51 is processed in layer n, while the inner structure 52 is processed in layer n+1. Perfect overlay means that distances between the inner structure 52 and the outer structure 51 are equal at both sides of the inner structure 52 in the same direction, i.e. $D_1=D_3$ and $D_2=D_4$. By measuring the distances $D_1$, $D_2$, $D_3$, $D_4$ between the outer structure 51 and the inner structure 52 and comparing these differences $D_1$, $D_2$, $D_3$, $D_4$ with the ideal position of the two structures 51, 52 with respect to each other, a situation that is depicted in FIG. 4a, overlay between layer n and layer n+1 may be determined.

Figure 4B:
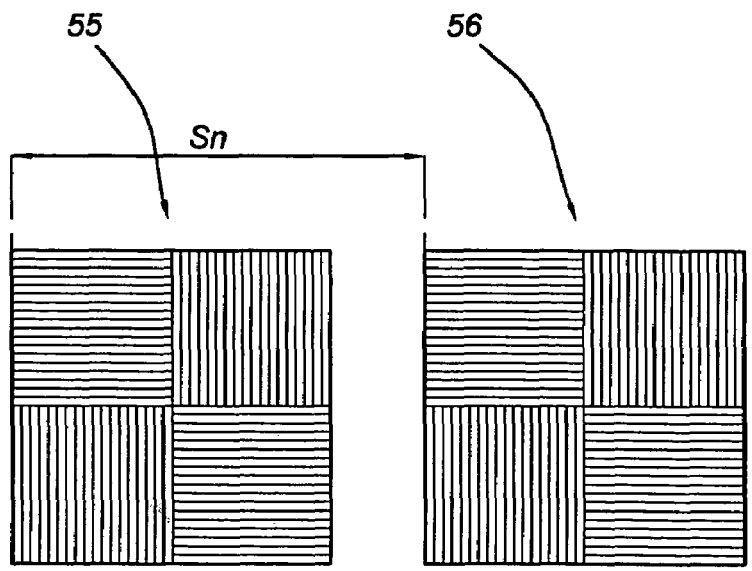
FIG. 4b depicts a typical example of an overlay alignment mark.

Alternatively, overlay may be determined by using alignment marks, as is depicted in FIG. 4b. In FIG. 4b, two alignment marks 55, 56 are schematically shown. Both alignment marks 55, 56 comprise a number of diffractive structures. The left alignment mark 55 is processed in layer n. The alignment mark 56 at the right is processed in layer n+1. The alignment marks 55, 56 are deliberately positioned with a certain predetermined offset $S_n$ with respect to each other in the respective layers. By measuring the diffractive orders of both alignment marks 55, 56 and comparing the positional difference of these orders with the expected positional difference as a result of aforementioned predetermined offset $S_n$, overlay between layer n and layer n+1 can be determined.

It is known to calculate a substrate model, i.e. numerical values for parameters like translation T, rotation R and/or expansion E of a substrate, before exposure that can be used to compute the position, expansion and/or orientation of a substrate based on measured positions of diffraction orders of alignment marks.

Usually, the position of a substrate (or a portion thereof) is determined based on positional information derived from a number of alignment marks, which my be spread over the surface of the substrate. In general, the more alignment marks are measured, the more accurately the position of the substrate may be determined.

When the position of a plurality of marks, e.g. alignment marks, across the surface of the substrate is determined, the related information may be supplied to a deformation model. For example, the deformation model may be arranged to determine the position and orientation of each target portion of the substrate. The deformation model may also be arranged to determine deformation within a target portion the results of such a deformation model may be used to make sure that each target portion will be correctly aligned during exposure.

The position of certain points on the substrate may be expressed as a translation T, a rotation R and an expansion E. In a so-called 6-parameter model, the translation in an x-direction is denoted as $T_x$, the translation in an y-direction, perpendicular to said x-direction, is denoted as $T_y$, the rotation of an axis in the x-direction about a z-axis is denoted as $R_{zx}$, the rotation of the y-axis about the z-axis is denoted as $R_{zy}$, the expansion in the x-direction is denoted as $E_x$, and, finally, the expansion in the y-direction is denoted as $E_y$ respectively.

With the measurements a substrate model comprising the translations $T_x$, $T_y$, rotations $R_{zx}$, $R_{zy}$ and expansions $E_x$, $E_y$ may be determined. Such a model may be solved using, e.g., a least square method, as will be understood by a person skilled in the art. Computing the substrate model parameters may include minimizing the differences between the computed positions of the marks, e.g. the alignment marks, and the measured positions of these marks. As a result of this difference correctables, i.e. instructions to correct for the recognized differences, are identified by the model.

Instead of aforementioned 6-parameter model, a more detailed characterization of process induced grid deformation may be employed to determine a grid model that exceeds the 6-parameter model in performance. This is especially needed when an underlying grid is no longer orthogonal. In such a case, a 6-parameter model no longer suffices and more complicated, higher-order models, are needed.

In order to correct for grid deformations, characterization of processes and apparatus is needed. If a certain model turns out to provide the best performance with respect to correcting grid deformations in a specific process step, this does not necessarily mean that this model is the best model to correct grid deformations in other process steps. Similarly, each apparatus may have its own grid deformation characteristics for which different model give the best performance. In determining the best performance not necessarily the model providing the best correctables is selected. Other requirements, e.g. related to the time needed to calculate the correctables, are taken into account. The best performing model is selected.

For example, consider a situation in which the set of models comprises two models, a first model using a $7^{th}$ order polynomial function with four coefficients, i.e. one for each odd order, and a second model using an exponential function. Upon supplying a number of measured positions, the two models are fitted to these measured positions. Such fitting may be done by using a least squares criterion as is known to persons skilled in the art. By comparing the least squares sums after completion of the fit, the model with the lowest least squares sum is selected as the best model.

Alternatively, a model may be selected that does not give the best correctables. For example, consider a situation in which the set of models comprises four models, i.e. a $1^{st}$ order model, a $3^{rd}$ order model, a $5^{th}$ order model and a $7^{th}$ order model. Each model only comprises odd orders and coefficients for these orders need to be fitted, e.g. by using a least squares criterion. After fitting the models are compared. As the number of marks to be aligned to obtain a reasonable fit for a higher order model, a boundary condition is imposed that a higher order model is only selected when a difference between a higher order fit and a lower order fit is large enough, i.e. when it indicates that the coefficient of the higher order gives a significant improvement. So, in this example, if the difference between the least squares sum of the seventh order fit and the fifth order fit is insignificant, while a similar comparison reveals that the difference between the least squares sum of the fifth order fit and the third order fit does provide a significant improvement, the fifth order model is selected.

Grid deformations may be caused by a process, however, they may also be caused by imperfections in a specific apparatus. A different model may therefore be selected for different situations. In order to select a correct model for grid deformations caused by a process step, measurement data is needed. For this reason, a lot of product substrates may be exposed and processed according to the process step on which a model needs to be fitted. A production substrate is defined as a substrate that is generated as part of a regular production process without application of special attributes or procedures. The exposure may be laid down in an expose recipe. Exposure of the production substrates in the lot results in a set of alignment data. For example, a lot of 25 substrates with 4 alignment marks per substrate will result in 100 alignment mark records. In this document, these records will be referred to as alignment data. After exposure, the substrate are developed, e.g. on a track, and overlay is verified offline by performing overlay measurements with a metrology apparatus. Typically, only a few substrates of the lot are verified, resulting in data referred to as metrology data for this particular lot.

Similarly, grid deformations may be due to an artifact in the apparatus used. In order to correct for this grid deformation, a model may be selected based on the apparatus on which the process is to be performed. In this case, similar measurements, i.e. alignment and overlay, have to be performed. However, the process needs to be performed on the apparatus under investigation and the substrates that are used are reference substrates. A reference substrate is a substrate generated on a system of which the grid is known, i.e. a system with a (verified) perfect grid. A control system like an APC-system may use the information with respect to grid deformations caused by apparatus imperfections to correct an expose recipe in a similar way for all exposures to be performed on that apparatus.

Figure 5:
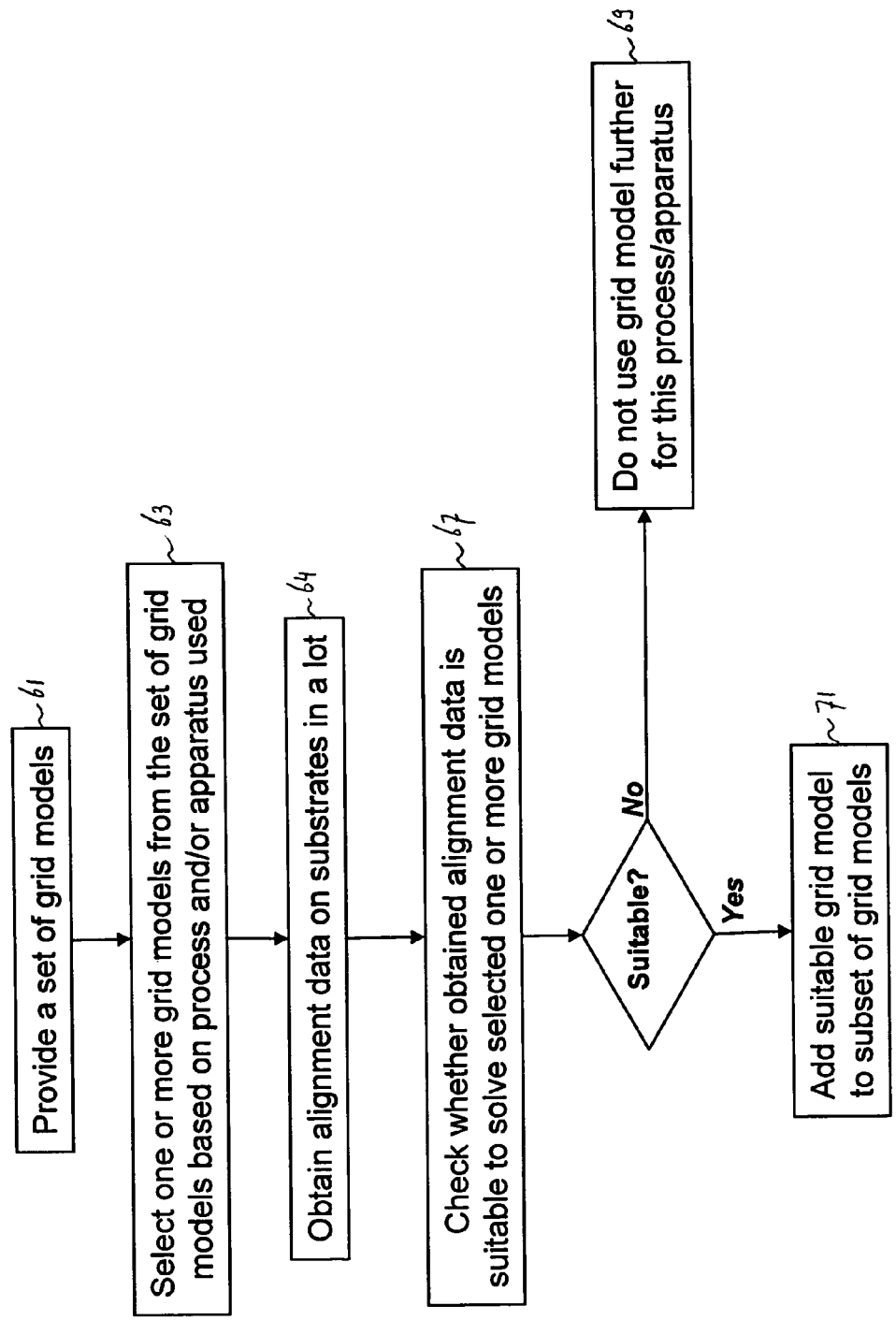
FIG. 5 depicts a flow chart of a method of correcting process induced grid deformation according to a first embodiment of the invention.

FIG. 5 depicts a flow chart of a method of correcting process induced grid deformation in a specific process step according to a first embodiment of the invention. First, in action 61, a set of grid models is provided. From this set of grid models, in action 63, one or more grid models may be selected. If such a selection occurs, the grid models are selected based on at least one of the specific process step that is performed and the apparatus on which the specific process step is performed in a way that is explained earlier in this description. Alternatively, in an embodiment, after action 61, the method immediately proceeds to action 64. In action 64, alignment data are obtained on substrates in a lot. It must be understood that action 64, although depicted in FIG. 5 as to occur later than actions 61 and 63, action 64, may alternatively also be performed earlier, i.e. before actions 61 and 63, as will be understood by a person skilled in the art.

Subsequently, in action 67, it is checked whether whether the alignment data as obtained in action 64 are suitable to solve the one or more grid models selected in action 63.

If the check in action 67 is unsuccessful, i.e. the alignment data as obtained in action 64 are not suitable to solve the grid model selected in action 63, in action 69, the respective grid model is not used further for the process and/or apparatus at hand. On the other hand, if the check in action 67 is successful, i.e. the alignment data as obtained in action 64 are suitable to solve the grid model being checked, the suitable grid model is added to a subset of grid models in action 71.

All grid models of the one or more selected grid models are checked. The resulting subset of grid models provides a subset of grid models that can be employed by a user. The positions of the alignment marks as obtained in action 64 may be compared with the positions predicted by the grid model under investigation, herewith forming so-called residuals. If the residuals from the grid model under investigation are smaller compared to residuals from the grid model selected at first, i.e. the grid model used during exposure of the alignment marks, the grid model under investigation is considered to be a better performing grid model. Generally, residuals of a higher order model are smaller than residuals of a lower order model. The user therefore generally selects the grid model of the highest order from the subset of grid models as the residuals of a grid model are often a measure of the ability of the model to describe a grid based on all data obtained. Better residuals do, however, not necessarily lead to an improvement of overlay. To determine the overlay performance, metrology data is needed.

Figure 6:
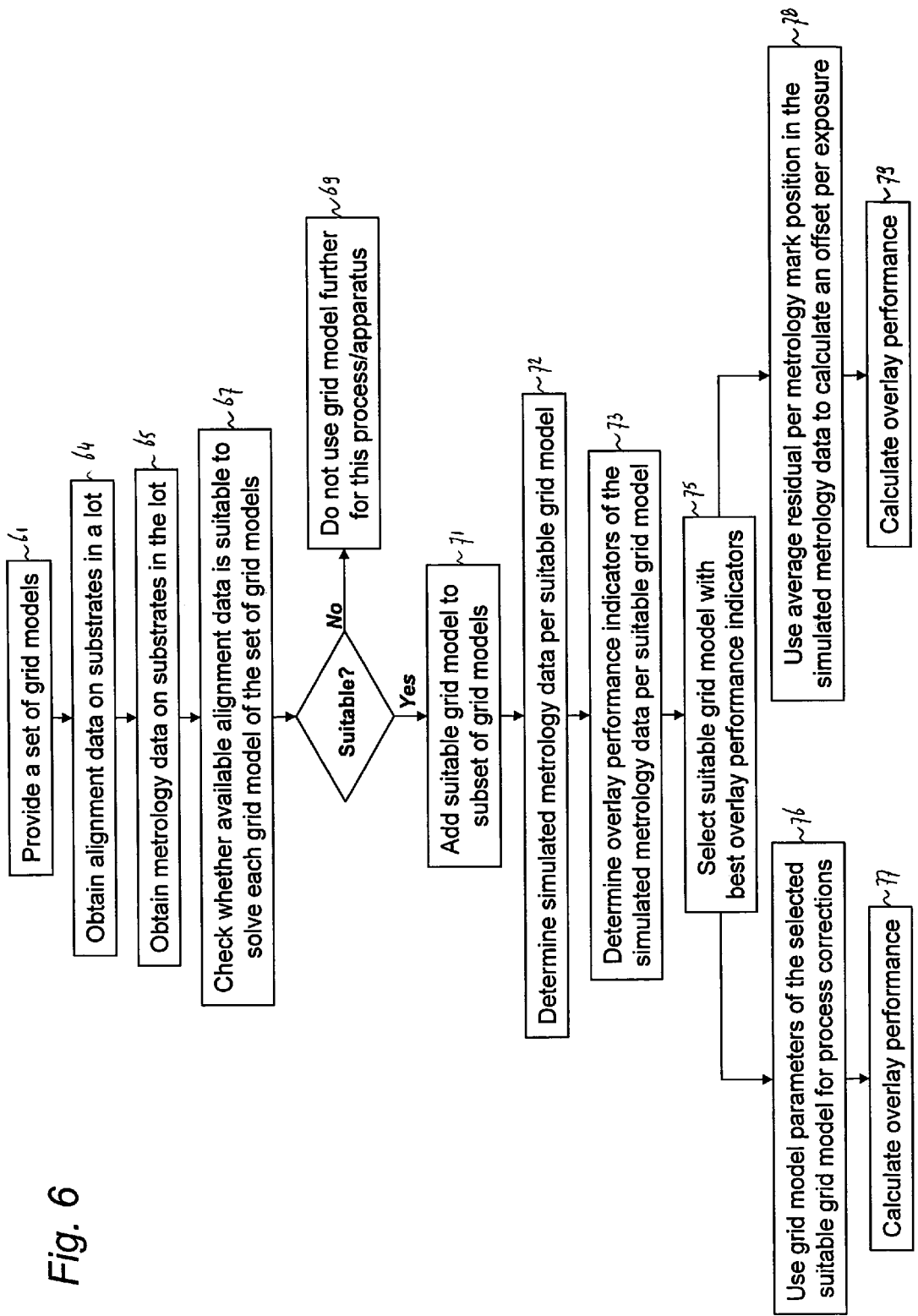
FIG. 6 depicts a flow chart of a method of correcting process induced grid deformation according to a second embodiment of the invention.

FIG. 6 depicts a flow chart of a method of correcting process induced grid deformation according to a second embodiment of the invention. In this embodiment, instead of solely using alignment data, also metrology data are used. Consequently, in this embodiment an overlay performance of a grid model can be evaluated. Again, as in the embodiment depicted in FIG. 5, in action 61, a set of grid models is provided. Subsequently, in action 64, alignment data are obtained on substrates in a lot. In addition, besides obtaining alignment data, in action 65, metrology data are obtained on substrates in the lot. Subsequently, again, in action 67, it is checked whether the available alignment data as obtained in action 64 are suitable to solve each grid model of the set of grid models. If the grid model under investigation turns out to be unsuitable, it will not be used further for this process and/or apparatus, as is schematically denoted by action 69. If, however, the grid model can be solved, the grid model is added as a suitable grid model to a subset of grid models in action 71.

Since alignment results may be influenced by the applied processing, there exists a risk that the improvements obtained with a better performing grid model do not correlate well enough with the actual grid of the substrate, i.e. the grid formed by the alignment marks after exposure. In order to avoid additional errors, verification whether an improvement by the better performing grid model is correlated with the substrate grid may be performed by using simulated metrology data. The simulated metrology data are determined, in action 72, by adding the difference between the position of each exposure calculated with the alignment parameters obtained with the better performing grid model and the position of each exposure revealed from the grid model used during exposure to the metrology data obtained on basis of the grid model used during exposure.

Subsequently, in action 73, for each suitable grid model overlay performance indicators of the simulated metrology data are determined. Examples of overlay performance indicators include mean value and 3 sigma, maximum value. Ways of calculating such indicators are well known in the art and will not be discussed here.

Subsequently, in action 75, all suitable grid models are compared by comparing the overlay performance indicators of each suitable grid model as determined in action 73. The suitable grid model with the best overlay performance indicators, i.e. the grid model with the least substrate-to-substrate variation, is selected.

Grid models may be able to produce static offsets of areas to be exposed, e.g. dies. These static offsets include translations, (asymmetric) rotations, and (asymmetric) magnifications. In an embodiment, between actions 73 and 75, it may be determined whether any of these offsets are present in the simulated metrology data, e.g. due to an overall substrate expansion or the like. If so, such offsets may be corrected by using (high order) process corrections.

Upon selection, several subsequent actions may be performed. First, in action 76, grid model parameters of the suitable grid model selected in action 75, may be used for process corrections, i.e. corrections that may be used to amend a process recipe of an exposure process. Subsequently, in action 77, the overlay performance may be calculated, i.e. the overlay that is expected when the selected grid model is used to apply aforementioned amendments. The result of this calculation may be reviewed by an operator.

Secondly, in action 78, it may be possible to use an average residual per metrology mark position in the simulated metrology data of the suitable grid model selected in action 76, to calculate an offset per exposure. The average is taken over all substrates within the lot on which data are obtained. The offset as calculated may be used to amend a so-called XY-sub-recipe, i.e. a recipe which provides a grid on which the expose recipe is projected. Again, subsequently, in action 79, the overlay performance may be calculated.

Actions 77 and 79 are performed after correction for offsets.

The grid deformations as calculated in the methods schematically depicted in the flow charts of FIGS. 5 and 6 may be calculated in the following way. First, the measured positions of the marks are compared with the positions of these marks expected from the expose recipe, i.e. the theoretical positions. Subsequently, residuals are determined, i.e. the measured positions of the marks are subtracted from aforementioned theoretical positions. The result of this subtraction is called the "residual". The residuals may have an effect on all parameters within the model. In case multiple marks of a similar type, e.g. a type sensitive to translations in a certain direction, are used within a grid, the residuals per mark may be averaged to form a so-called average grid fingerprint. The average grid fingerprint may then be subtracted from the residual per mark. Finally, in case multiple substrates are used in the measurements, the average residual for each mark position over all measured substrates may be determined in a way known to persons skilled in the art.

It is to be understood that the accuracy of the methods as explained with reference to the flow charts in FIGS. 5 and 6 increases when a larger number of substrates is used, as the average grid fingerprint per mark position becomes more accurate. To determine the relevance of the last correction, i.e. the translations in case of the use of minimization of the sum of squared residuals, and, additional magnification and rotation corrections in case of minimization of a maximum vector length as described above, a random process noise (RPN) can be determined. The residual noise on an average fingerprint $RN_{af}$ is given by:

$$RN_{af} = \frac{RPN}{\sqrt{N_s}} \quad (1)$$

in which $N_s$ is the number of substrates. When the "3σ", i.e. at least 99.7% of the values, of the average residual fingerprint as determined over the average residuals of all grids is larger than $$\frac{RPN}{\sqrt{N_s}},$$

a correction may be assumed relevant.

FIGS. 7a-c schematically depict a first example of determining grids by a grid model in accordance with embodiments of the invention. In this example, no deformations between fields take place, i.e. there are no inter-field deformations. In FIG. 7a, on the left side, a substrate W is shown provided with two overlay alignment marks 81 in layer n, e.g. layer 0. Based on alignment measurements performed on these marks 81, a first grid is determined (on the right side of FIG. 7a), by using a first grid model selected from a set of grid models as explained earlier with respect to FIGS. 5 and 6. The grid is constructed using coordinate lines, denoted in FIG. 7a by arrowed lines 83 and 84.

The first grid as determined is used to align the substrate W for the next exposure step, in which a first repetitive pattern 85 as shown in FIG. 7b is formed on the substrate W in layer n+1, e.g. layer 1. The pattern 85 comprises a plurality of marks 87, which are used to determine a second grid 92 as schematically depicted at the right in FIG. 7b. This second grid is determined by a second grid model selected from the set of grid models. In an embodiment, the second grid model may be the same grid model as the first grid model that was used to determined the first grid. In another embodiment, the second grid model is different from the first grid model.

The second grid 92 is now used to align the substrate W for the next exposure step in which a second repetitive pattern 88 as shown in FIG. 7c is formed on the substrate W in layer n+2, e.g. layer 2. The pattern 88 comprises a plurality of marks 90, which are used to determine a third grid 94 as schematically depicted at the right in FIG. 7c. Also the third grid is determined with one of the grid models of the set of grid models. Again, this third grid model may be equal or different to the first and/or second grid model.

The third grid 94 is then used to align the substrate W for the next exposure step, i.e. in layer n+3 etc. As there are no deformations in this case, the first grid, second grid and third grid are similar, and no adjustments caused by differences between grids need to be applied.

Figure 8A:
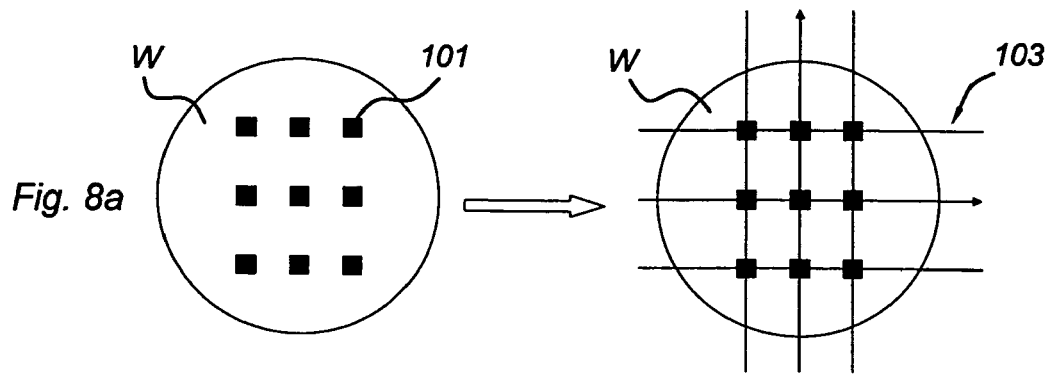
FIGS. 8a-c schematically depict a second example of determining grids by a grid model in accordance with embodiments of the invention.
Figure 8B:
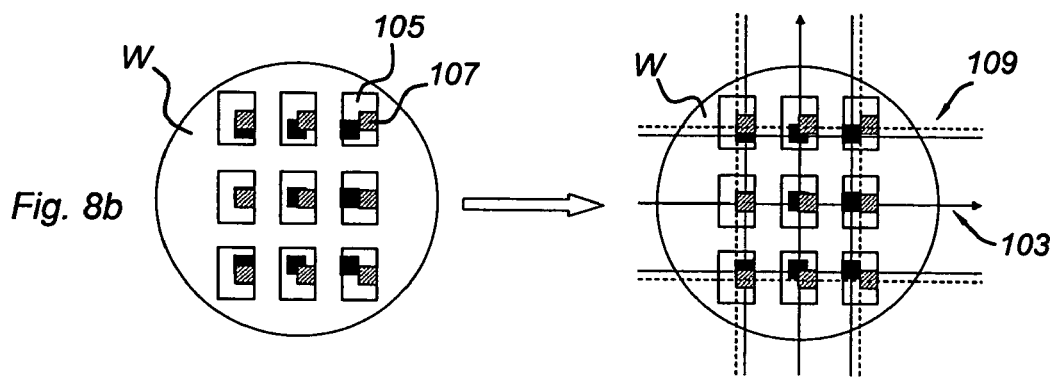
Figure 8C:
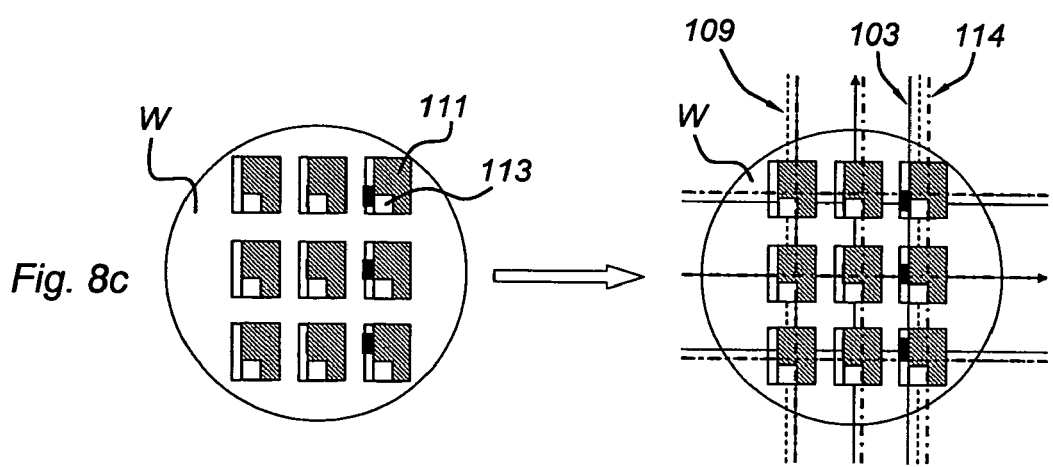

FIGS. 8a-c schematically depict a second example of determining grids by a grid model in accordance with embodiments of the invention. In this case there are inter-field deformations. For each layer, a grid model is selected from a set of grid models in a way explained earlier in this specification.

In FIG. 8a, at the left side a substrate W is shown provided with a plurality of overlay alignment marks 101 in layer n, e.g. layer 0. Based on alignment measurements performed on these marks 101 a first grid 103 is determined (on the right side of FIG. 8a). The first grid 103 is denoted by the solid lines.

The first grid 103 as determined, is used to align the substrate W for the next exposure step, in which a first repetitive pattern 105 as shown in FIG. 8b is formed on the substrate W in layer n+1, e.g. layer 1. The pattern 105 comprises a plurality of marks 107, which are used to determine a second grid 109 as schematically depicted at the right in FIG. 8b. The second grid 109 is denoted by the dashed lines. For comparison, the first grid 103 is again denoted by the solid lines. It can be seen that the first grid and second grid are not equal to each other. In this case, the grid deformation can be corrected by an expansion correction, i.e. by changing expansion in x- and y-direction, $E_x$ and $E_y$.

The second grid 109 is now used to align the substrate W for the next exposure step in a which a second repetitive pattern 111 is formed on the substrate W in layer n+2, e.g. layer 2. So, before exposure, the magnification is corrected, either by changing the position of the substrate W with respect to a reticle or by adapting the process recipe of this layer with respect to this matter. The pattern 111 comprises a plurality of marks 113, which are used to determine a third grid 114 as denoted by the dotted-dashed line in the right part of FIG. 8c. It can be readily seen that the second and third grid are not equal to each other. In this case, a grid correction may be performed by a translational correction.

Subsequently, the third grid 114 may be used to align the substrate W for the next exposure step, i.e. in layer n+3 etc. Before exposure, the substrate W will be aligned by using the first grid in layer n, the expansion deformation formed in layer n+1 will be adapted using the second grid and the translational deformation formed in layer n+2 will be corrected for by using the third grid. Thus, during alignment, all past grid deformations are taken into account.

A control unit, e.g. control unit 13, may adapt the position of the substrate W with respect to a reticle, i.e. first the substrate W is moved towards a correct position with respect to the first grid after which this position is corrected to account for the difference between the first and second grid, i.e. aforementioned expansion difference. Alternatively, the control unit, e.g. control unit 13, may adapt the process recipe, i.e. to account for a different expansion than programmed.

Overlay measurements may be performed on a single substrate, but alternatively, it is possible to perform a series of overlay measurements on several substrates, in particular several substrate within a single lot. Corrections may then be established by using the series of overlay measurements.

Corrections may be determined by using minimization methods like least squares techniques on the results obtained by the overlay measurements on a single substrate or the series of overlay measurements on several substrate, as is known to persons skilled in the art.

In a minimization method like the least squares algorithm, a sum of squared residuals is minimized, typically the sum of squared residuals per exposure field. A residual is defined as a result of a subtraction of a correction as established by embodiments of aforementioned method of correcting a process recipe for grid deformations, from the original positions as set out in an exposure recipe, e.g. a position within a set of circuit patterns.

Generally, there will be a spatial variation of residual size and direction, i.e. there exists a residual variation per field. To optimize for a maximum overlay value in a field, a method as schematically depicted in a flow chart of FIG. 5 or 6 may be used.

EXAMPLE

Figure 9C:
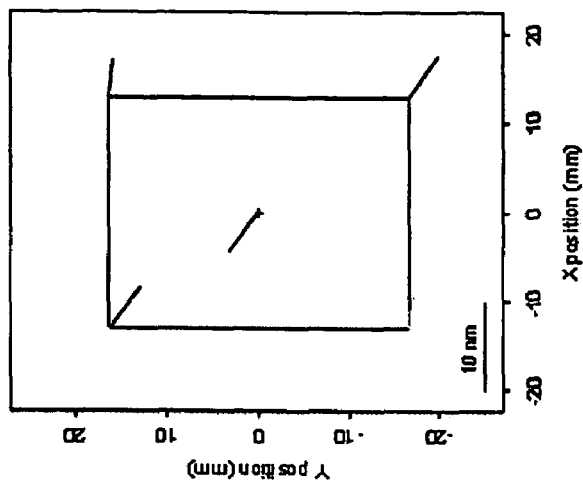
FIGS. 9a-c schematically depict an example of implementing embodiments of the method according to the invention for deformations within a field.
Figure 9B:
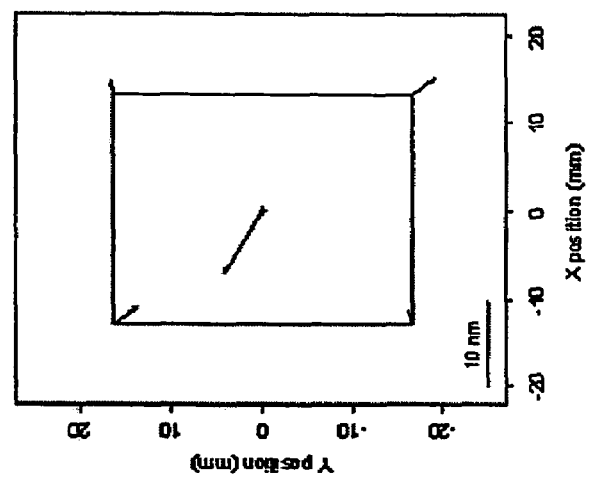
Figure 9A:
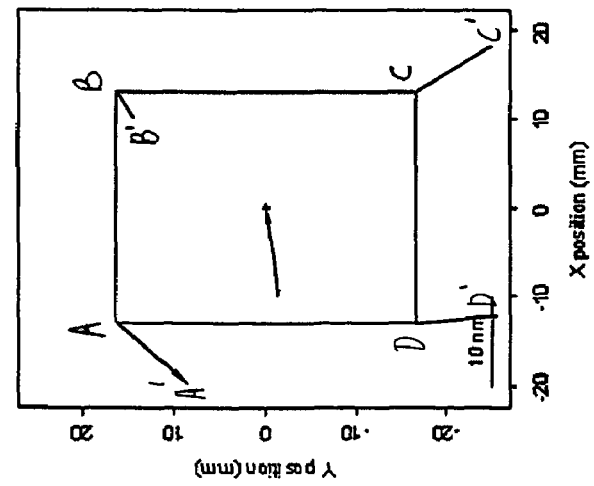

FIGS. 9a-c schematically depict an example of implementing embodiments of the method according to the invention for deformations within a field, i.e. the method of correcting a process recipe for grid deformations is applied to make corrections within a field, i.e. intra-field corrections. In this example only one field per substrate is depicted for sake of clarity.

For a certain process and layer under investigation, first, a number of substrates provided with suitable marks are measured, e.g. in an offline metrology apparatus. As described earlier in this description, a model may be developed, which determines a number of parameters, which may serve as correctional parameters. The parameters as determined may include both inter-field parameters and intra-field parameters. Inter-field parameters, i.e. parameters that may have an influence between fields, may include translation in a first direction, denoted as x-direction, $T_x$, translation in a second direction, denoted as y-direction, the second direction being perpendicular to aforementioned first direction, $T_y$, Expansion in x-direction $E_x$, expansion in y-direction $E_y$, rotation R and notch orientation NO. Intra-field parameters, i.e. parameters that may have an influence within a field, may include magnification in x-direction $M_x$, magnification in y-direction $M_y$, symmetric rotation $R_s$, i.e.

$$\frac{R_x + R_y}{2}$$

and asymmetric rotation $R_a$, i.e.

$$\frac{R_x - R_y}{2}.$$

The aforementioned model is an intra-field model and is determined for all fields on a certain substrate. Positions within fields calculated with the model are subtracted from their positions as originally set out in an exposure recipe, and consequently, residuals are left. These residuals form a so-called fingerprint per substrate.

Subsequently, an average over all substrates, and hence over all fingerprints, is taken to obtain an average fingerprint per field, i.e. an average field fingerprint. Note that in order to obtain a field fingerprint at least 4 metrology marks need to be measured per field. In FIG. 9a, an example of an average field fingerprint is given. The dotted lines show the difference between original positions A, B, C, D, E and optimized positions A', B', C', D', E' in accordance with a selected model, which takes the entire substrate into account, e.g. a 10-parameter inter- and intra-field model, respectively.

Subsequently, optimized positions obtained with an intra-field substrate model, selected in a similar fashion as the inter- and intra-field model in accordance with a method, e.g. the embodiments depicted in FIGS. 5 and 6, are subtracted from the original positions. This further subtraction results in a residual fingerprint, which is depicted in FIG. 9b. It can be seen that this fingerprint is not optimized for maximum overlay. As the largest overlay value per field determines its quality, an additional change is applied.

By applying a suitable translation in both X and Y-direction, the maximum overlay value is reduced as can be seen in FIG. 9c in this example, an improvement in the average of the maximum overlay value of 0.8 nm is achieved, i.e. from 4.2 nm to 3.4 nm.

A more advanced correction mechanism may give even better results. For example, the model used for determining corrections in a fingerprint may minimize a maximum vector length instead of a sum of squared residuals. In this way in addition to a change in translation also magnification and rotation parameters can be optimized for a maximum field overlay value.

As can be readily understood, again, the RPN has an influence on the measurements. The measurement error per grid position is proportional to $$\frac{RPN}{\sqrt{N_s}}.$$

Additionally, there exists a field to field noise, i.e. the variation of the intra-field parameters from field to field. Such field to field noise may for example be induced by exposure errors or lens heating. Also the effect of aforementioned field to field noise on the measured grid is proportional to $$\frac{RPN}{\sqrt{N_s}}.$$

Figure 10:
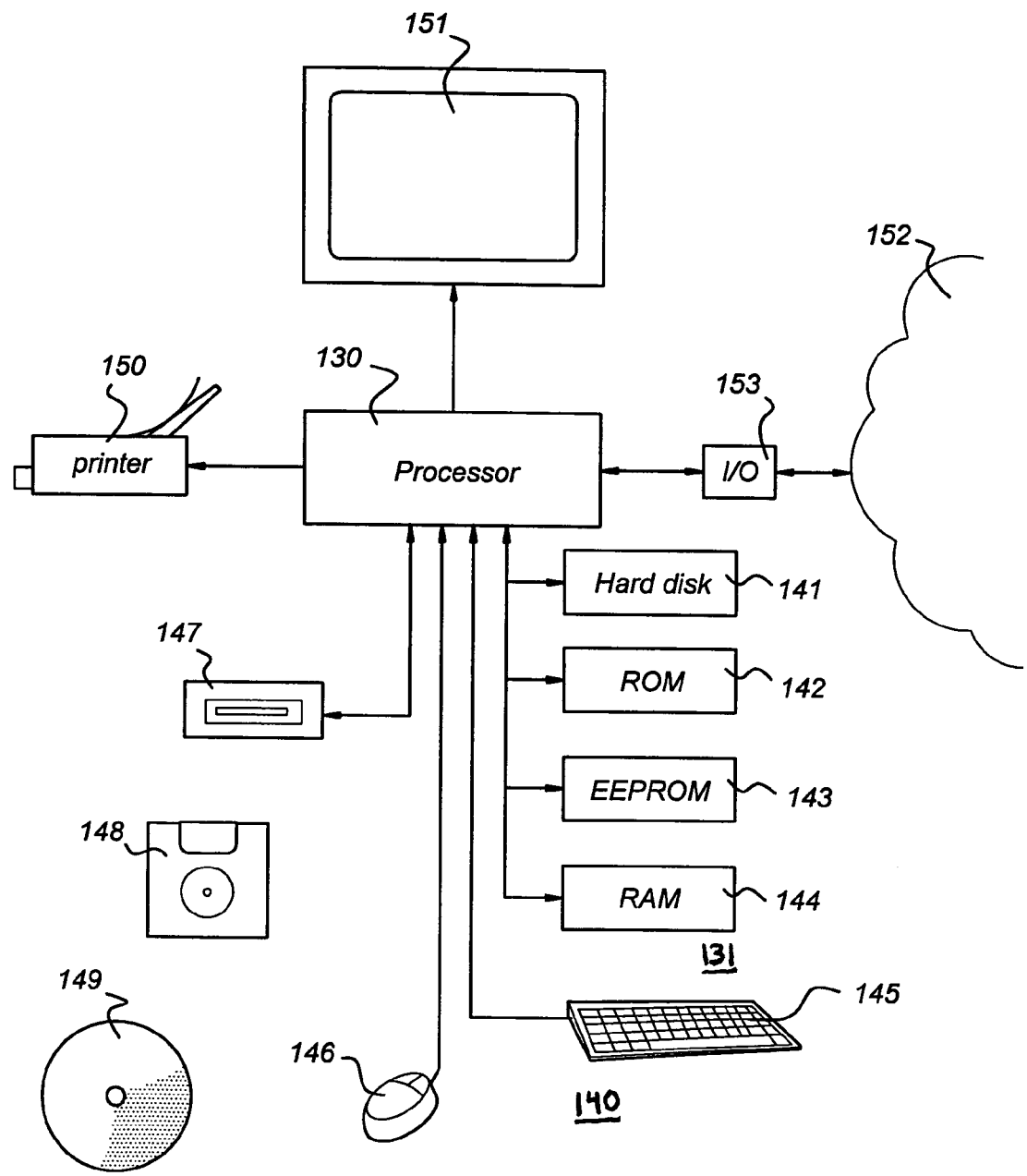
FIG. 10 depicts a more detailed embodiment of a control unit that may be used in embodiments of the present invention.

It should be understood that the term control unit, e.g. control unit 13, 23, and the term control system 40, as used throughout this text may be implemented in the form of a computer assembly 140 as shown in FIG. 10. The computer assembly 140 comprises a processor 130 and a memory 131 connected to the processor 130. The memory 131 may comprise a number of memory components like a hard disk 141, Read Only Memory (ROM) 142, Electrically Erasable Programmable Read Only Memory (EEPROM) 143 Random Access Memory (RAM) 144. Not all aforementioned memory components need to be present. Furthermore, it is not essential that aforementioned memory components are physically in close proximity to the processor 130 or to each other. They may be located at a distance away from the processor 130 or each other.

The processor 130 may also be connected to some kind of user interface, for instance a keyboard 145 or a mouse 146. A touch screen, track ball, speech converter or other interfaces that are known to persons skilled in the art may also be used.

The processor 130 may be connected to a reading unit 147, which is arranged to read data from and under some circumstances store data on a data carrier, like a floppy disc 148 or a CDROM 149. Also DVD's or other data carriers known to persons skilled in the art may be used.

The processor 130 may also be connected to a printer 150 to print out output data on paper as well as to a display 151, for instance a monitor or LCD (Liquid Crystal Display), of any other type of display known to a person skilled in the art.

The processor 130 may be connected to a communications network 152, for instance a public switched telephone network (PSTN), a local area network (LAN), a wide area network (WAN), etc., by means of transmitters/receivers 153 responsible for input/output (I/O). The processor 130 may be arranged to communicate with other communication systems via the communications network 152. In an embodiment of the invention external computers (not shown), for instance personal computers of operators, can log into the processor 130 via the communications network 152.

The processor 130 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 130 may even be located a distance away of the other processing units and communicate via communications network 152.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of selecting a grid model for correcting a process recipe for grid deformations in a lithographic apparatus comprising:
    providing a set of grid models to align a substrate to be exposed to a patterned beam of radiation in the lithographic apparatus;
    obtaining alignment data by performing an alignment measurement on a first plurality of alignment marks disposed on a plurality of first substrates;
    checking for each grid model of the set of grid models whether alignment data as obtained is suitable to solve the grid model and, if the alignment data is suitable to solve the grid model, adding the grid model to a subset of grid models; and
    selecting a grid model from the subset of grid models with lowest residuals to use during exposure of the substrate.

2. The method according to claim 1, wherein the method further comprises:
    determining average grid model parameters of the grid model as selected; and
    using the average grid model parameters as determined for process corrections.

3. The method according to claim 1, wherein the method further comprises:
    determining an average residual of said first plurality of alignment marks per position;
    calculating an offset per exposure; and
    using the offset per exposure as calculated for process corrections.

4. The method according to claim 1, wherein the method comprises selecting one or more grid models from the set of grid models based on (i) the process recipe, (ii) the lithographic apparatus on which the process recipe is executed, or both (i) and (ii) after said providing a set of grid models.

5. The method according to claim 4, wherein said selecting a grid model based on the process recipe is related to a method comprising:
    performing an alignment measurement on a second plurality of alignment marks disposed on a second substrate;
    performing an overlay measurement on a first plurality of overlay marks on the second substrate; and
    selecting a grid model from the set of grid models with an optimized performance with respect to process corrections, the process corrections being calculated based on the alignment measurement and the overlay measurement.

6. The method according to claim 5, wherein the second substrate is a production substrate.

7. The method according to claim 4, wherein said selecting a grid model based on the process recipe is related to a method comprising:
    performing an alignment measurement on a third plurality of alignment marks disposed on a third substrate;
    performing an overlay measurement on a second plurality of overlay marks on the third substrate; and
    selecting a grid model from the set of grid models with an optimized performance with respect to process corrections, the process corrections being calculated based on the alignment measurement and the overlay measurement.

8. The method according to claim 7, wherein the third substrate is a reference substrate.

9. The method according to claim 2, wherein using the average grid model parameters comprises:
    calculating grid deformations using the average grid model parameters as determined, the grid deformations being deformations of a process grid as used in the process recipe; and
    correcting the process recipe by applying the grid deformations as calculated.

10. The method according to claim 9, wherein applying the grid deformations includes correcting a positional parameter of a group comprising translation, rotation and expansion.

11. A computer program product for performing, when executed by a processor, a method of selecting a grid model for correcting a process recipe for grid deformations in a lithographic apparatus, the method comprising:
    providing a set of grid models to align a substrate to be exposed to a patterned beam of radiation in the lithographic apparatus;
    obtaining alignment data by performing an alignment measurement on a first plurality of alignment marks disposed on a plurality of first substrates;
    checking for each grid model of the set of grid models whether alignment data as obtained is suitable to solve the grid model and, if the alignment data is suitable to solve the grid model, adding the grid model to a subset of grid models; and selecting a grid model from the subset of grid models with lowest residuals to use during exposure of the substrate.

12. A lithographic assembly comprising:

a lithographic system comprising a lithographic apparatus configured to project a patterned beam of radiation onto a target portion of a substrate, a control unit arranged to control settings of the lithographic apparatus and an alignment system arranged to perform an alignment measurement on the substrate prior and/or after projection by the lithographic apparatus and to generate alignment data;

a metrology system comprising a metrology apparatus and a metrology control unit, said metrology system being arranged to perform an overlay measurement on said substrate and to generate metrology data as a result of the overlay measurement; and a control system connected to both said lithographic system and said metrology system, and arranged to receive said alignment data from said lithographic system and said metrology data from said metrology system, wherein said control system comprises a processor and a memory, said memory being connected to said processor and arranged to store a process recipe and a set of models, and wherein said lithographic assembly is arranged to perform a method of selecting a grid model for correcting a process recipe for grid deformations in a lithographic apparatus, the method comprising:

providing a set of grid models to align the substrate to the patterned beam of radiation in the lithographic apparatus;

obtaining alignment data by performing an alignment measurement on a first plurality of alignment marks disposed on a plurality of first substrates;

checking for each grid model of said set of grid models whether alignment data as obtained is suitable to solve the grid model and, if the alignment data is suitable to solve the grid model, adding the grid model to a subset of grid models; and selecting a grid model from the subset of grid models with lowest residuals to use during exposure of the substrate.

13. The lithographic assembly according to claim 12, wherein said process recipe comprises machine instructions and said control unit is arranged to apply said machine instructions to said lithographic apparatus.

14. The lithographic assembly according to claim 13, wherein said lithographic apparatus comprises:

an illumination system configured to condition a radiation beam;

a support constructed to support the patterning device, the patterning device being capable of imparting the radiation beam with a pattern in its cross-section to form the patterned radiation beam;

a substrate table constructed to hold the substrate; and a projection system configured to project the patterned radiation beam onto a target portion of the substrate;

wherein at least one of said machine instructions in said process recipe relates to a relative position of said support with respect to said substrate table.

15. The lithographic assembly according to claim 12, wherein said control system is an advanced process control system.

16. A device manufacturing method comprising transferring a pattern from a patterning device onto a substrate using a lithographic assembly, the lithographic assembly comprising:

a lithographic system comprising a lithographic apparatus configured to project a patterned beam of radiation onto a target portion of a substrate, a control unit arranged to control settings of said lithographic apparatus and an alignment system arranged to perform an alignment measurement on said substrate prior and/or after projection by said lithographic apparatus and to generate alignment data;

a metrology system comprising a metrology apparatus and a metrology control unit, said metrology system being arranged to perform an overlay measurement on said substrate and to generate metrology data as a result of the overlay measurement; and a control system connected to both said lithographic system and said metrology system, and arranged to receive said alignment data from said lithographic system and said metrology data from said metrology system, wherein said control system comprises a processor and a memory, said memory being connected to said processor and arranged to store a process recipe and a set of models, and wherein said lithographic assembly is arranged to perform a method of selecting a grid model for correcting a process recipe for grid deformations in a lithographic apparatus, the method comprising:

providing a set of grid models to align the substrate to the patterned beam of radiation;

obtaining alignment data by performing an alignment measurement on a first plurality of alignment marks disposed on a plurality of first substrates;

checking for each grid model of said set of grid models whether alignment data as obtained is suitable to solve the grid model and, if the alignment data is suitable to solve the grid model, adding the grid model to a subset of grid models; and selecting a grid model from the subset of grid models with lowest residuals to use during exposure of the substrate.

17. A method of selecting a grid model for correcting a process recipe for grid deformations in a lithographic apparatus, comprising:

providing a set of grid models;

obtaining alignment data by performing an alignment measurement on a first plurality of alignment marks on a plurality of first substrates;

obtaining metrology data by performing an overlay measurement on a first plurality of overlay marks on the plurality of first substrates;

checking for each grid model of said set of grid models whether alignment data as obtained is suitable to solve the grid model and, if the alignment data is suitable to solve the grid model adding the grid model to a subset of grid models;

determining simulated metrology data for each grid model of said subset of grid models;

determining overlay performance indicators of the simulated metrology data for each grid model of said subset of grid models; and selecting the grid model using the overlay performance indicators as determined.

18. The method according to claim 17, wherein the method further comprises:

determining grid model parameters of the grid model as selected; and using the grid model parameters as determined for process corrections.

19. The method according to claim 18, wherein the method further comprises calculating an expected overlay performance if said grid model parameters as determined are used for process corrections.

20. The method according to claim 17, the method further comprising:
   determining an average residual of said metrology data per overlay mark position;
   calculating an offset per exposure; and
   using the offset per exposure as calculated for process corrections.

21. The method according to claim 20, wherein the method further comprises calculating an expected overlay performance if said offset per exposure as determined is calculated for process corrections.

22. The method according to claim 17, wherein the method comprises selecting one or more grid models from the set of grid models based on (i) the process recipe, (ii) the lithographic apparatus on which the process recipe is executed after said providing a set of grid models, or both (i) and (ii).

23. The method according to claim 22, wherein said selecting a grid model based on the process recipe is related to a method comprising:
   performing an alignment measurement on a second plurality of alignment marks on a second substrate;
   performing an overlay measurement on a first plurality of overlay marks on the second substrate; and
   selecting a grid model from the set of grid models with an optimized performance with respect to process corrections, the process corrections being calculated based on the alignment measurement and the overlay measurement.

24. Method according to claim 23, wherein the second substrate is a production substrate.

25. The method according to claim 22, wherein said selecting a grid model based on the process recipe is related to a method comprising:
   performing an alignment measurement on a third plurality of alignment marks on a third substrate;
   performing an overlay measurement on a second plurality of overlay marks on the third substrate; and
   selecting a grid model from the set of grid models with an optimized performance with respect to process corrections, the process corrections being calculated based on the alignment measurement and the overlay measurement.

26. The method according to claim 25, wherein the third substrate is a reference substrate.

27. The method according to claim 18, wherein using the grid model parameters comprises:
   calculating grid deformations using said grid model parameters as determined, said grid deformations being deformations of a process grid as used in said process recipe; and
   correcting said process recipe by applying said grid deformations as calculated.

28. The method according to claim 27, wherein applying said grid deformations includes correcting a positional parameter of a group comprising translation, rotation and expansion.

29. A computer program product for performing, when executed by a processor, the method of selecting a grid model for correcting a process recipe for grid deformations in a lithographic apparatus as defined by claim 17.

30. A lithographic assembly comprising:
   a lithographic system comprising a lithographic apparatus configured to project a patterned beam of radiation onto a target portion of a substrate, a control unit arranged to control settings of said lithographic apparatus and an alignment system arranged to perform an alignment measurement on said substrate prior and/or after projection by said lithographic apparatus and to generate alignment data;
   a metrology system comprising a metrology apparatus and a metrology control unit, said metrology system being arranged to perform an overlay measurement on said substrate and to generate metrology data as a result of the overlay measurement; and
   a control system connected to both said lithographic system and said metrology system, and arranged to receive said alignment data from said lithographic system and said metrology data from said metrology system, wherein said control system comprises a processor and a memory, said memory being connected to said processor and arranged to store a process recipe and a set of models, and
   wherein said lithographic assembly is arranged to perform a method of selecting a grid model for correcting a process recipe for grid deformations in a lithographic apparatus,
   the method comprising:
   providing a set of grid models;
   obtaining alignment data by performing an alignment measurement on a first plurality of alignment marks on a plurality of first substrates;
   obtaining metrology data by performing an overlay measurement on a first plurality of overlay marks on the plurality of first substrates;
   checking for each grid model of said set of grid models whether alignment data as obtained is suitable to solve the grid model, and if the alignment data is suitable to solve the grid model, adding the grid model to a subset of grid models;
   determining simulated metrology data for each grid model of said subset of grid models;
   determining overlay performance indicators of the simulated metrology data for each grid model of said subset of grid models; and
   selecting the grid model using the overlay performance indicators as determined.

31. The lithographic assembly according to claim 30, wherein said process recipe comprises machine instructions and said control unit is arranged to apply said machine instructions to said lithographic apparatus.

32. The lithographic assembly according to claim 31, wherein said lithographic apparatus comprises:
   an illumination system configured to condition a radiation beam;
   a support constructed to support a patterning device, the patterning device being capable of imparting the radiation beam with a pattern in its cross-section to form the patterned radiation beam;
   a substrate table constructed to hold the substrate; and
   a projection system configured to project the patterned radiation beam onto a target portion of the substrate,
   wherein at least one of said machine instructions in said process recipe relates to a relative position of said support with respect to said substrate table.

33. The lithographic assembly according to claim 30, wherein said control system is an advanced process control system.

34. A device manufacturing method comprising transferring a pattern from a patterning device onto a substrate using a lithographic assembly, the lithographic assembly comprising:

a lithographic system comprising a lithographic apparatus configured to project a patterned beam of radiation onto a target portion of a substrate, a control unit arranged to control settings of said lithographic apparatus and an alignment system arranged to perform an alignment measurement on said substrate prior and/or after projection by said lithographic apparatus and to generate alignment data;

a metrology system comprising a metrology apparatus and a metrology control unit, said metrology system being arranged to perform an overlay measurement on said substrate and to generate metrology data as a result of the overlay measurement; and a control system connected to both said lithographic system and said metrology system, and arranged to receive said alignment data from said lithographic system and said metrology data from said metrology system, wherein said control system comprises a processor and a memory, said memory being connected to said processor and arranged to store a process recipe and a set of models, and wherein said lithographic assembly is arranged to perform the method of selecting a grid model for correcting a process recipe for grid deformations in a lithographic apparatus, the method comprising:

providing a set of grid models;

obtaining alignment data by performing an alignment measurement on a first plurality of alignment marks on a plurality of first substrates;

obtaining metrology data by performing an overlay measurement on a first plurality of overlay marks on the plurality of first substrates;

checking for each grid model of said set of grid models whether alignment data as obtained is suitable to solve the grid model, and if the alignment data is suitable to solve the grid model, adding the grid model to a subset of grid models;

determining simulated metrology data for each grid model of said subset of grid models;

determining overlay performance indicators of the simulated metrology data for each grid model of said subset of grid models; and selecting the grid model using the overlay performance indicators as determined.

* * * * *

UNITED STATES PATENT AND TRADEMARK OFFICE
CERTIFICATE OF CORRECTION

PATENT NO. : 7,468,795 B2
APPLICATION NO. : 11/484849
DATED : December 23, 2008
INVENTOR(S) : Hubertus Johannes Gertrudus Simons et al.

It is certified that error appears in the above-identified patent and that said Letters Patent is hereby corrected as shown below:

On the title page item (56) insert under References Cited: Foreign Patent Documents list:

-- EP 1 603 153 A1   12/2005 --

Signed and Sealed this

Ninth Day of June, 2009

JOHN DOLL
*Acting Director of the United States Patent and Trademark Office*